(12) United States Patent
Liu et al.

(10) Patent No.: US 7,592,093 B2
(45) Date of Patent: Sep. 22, 2009

(54) METHOD FOR MANUFACTURING A FLAT PANEL DIRECT METHANOL FUEL CELL

(75) Inventors: Yung-Yi Liu, Taipei Hsien (TW); James Shang, Taoyuan (TW); Shing-Fun Ho, Taipei (TW); Yi-Chen Chen, Taoyuan County (TW)

(73) Assignee: Nan Ya Printed Circuit Board Corporation, Luchu, Taoyuan (TW)

( * ) Notice: Subject to any disclaimer, the term of this patent is extended or adjusted under 35 U.S.C. 154(b) by 589 days.

(21) Appl. No.: 11/161,076

(22) Filed: Jul. 22, 2005

(65) Prior Publication Data

US 2006/0292435 A1    Dec. 28, 2006

(30) Foreign Application Priority Data

Dec. 8, 2004    (TW)    ............................... 93138041 A

(51) Int. Cl.
*H01M 8/00* (2006.01)
*H01M 2/14* (2006.01)
*H01M 4/00* (2006.01)
*G03F 1/00* (2006.01)

(52) U.S. Cl. ............................. 429/44; 429/12; 429/38; 430/323

(58) Field of Classification Search ................. 174/254; 430/323; 429/38, 32, 44
See application file for complete search history.

(56) References Cited

U.S. PATENT DOCUMENTS

| 4,693,959 | A  | * | 9/1987  | Ashcraft ..................... 430/323 |
| 6,326,554 | B1 | * | 12/2001 | Gillette et al. ............... 174/254 |
| 7,220,507 | B2 | * | 5/2007  | Liu et al. ...................... 429/32 |
| 2005/0214621 | A1 | * | 9/2005 | Liu et al. ...................... 429/38 |

* cited by examiner

*Primary Examiner*—Dah-Wei D Yuan
*Assistant Examiner*—Adam A Arciero
(74) *Attorney, Agent, or Firm*—Winston Hsu

(57) ABSTRACT

A novel flat panel DMFC (direct methanol fuel cell) includes an integrated cathode electrode plate, a membrane electrode assembly (MEA) unit, an intermediate bonding layer, an integrated anode electrode plate, and a fuel container. The integrated cathode and anode electrode plates are manufactured by using PCB compatible processes. The integrated cathode and anode electrode plates have embedded metal layout and improved heat dissipation capability.

11 Claims, 14 Drawing Sheets

METHOD FOR MANUFACTURING A FLAT PANEL DIRECT METHANOL FUEL CELL

BACKGROUND OF THE INVENTION

1. Field of the Invention

The present invention relates generally to the field of fuel cells, and more particularly, to a flat panel Direct Methanol Fuel Cell (DMFC) and method of making the same.

2. Description of the Prior Art

A fuel cell is an electrochemical cell in which a free energy change resulting from a fuel oxidation reaction is converted into electrical energy. Fuel cells utilizing methanol as fuel are typically called Direct Methanol Fuel Cells (DMFCs), which generate electricity by combining gaseous or aqueous methanol with air. DMFC technology has become widely accepted as a viable fuel cell technology that offers itself to many application fields such as electronic apparatuses, vehicles, military equipment, the aerospace industry, and so on.

DMFCs, like ordinary batteries, provide DC electricity from two electrochemical reactions. These reactions occur at electrodes (or poles) to which reactants are continuously fed. The negative electrode (anode) is maintained by supplying methanol, whereas the positive electrode (cathode) is maintained by the supply of air. When providing current, methanol is electrochemically oxidized at the anode electrocatalyst to produce electrons, which travel through the external circuit to the cathode electrocatalyst where they are consumed together with oxygen in a reduction reaction. The circuit is maintained within the cell by the conduction of protons in the electrolyte. One molecule of methanol (CH3OH) and one molecule of water (H2O) together store six atoms of hydrogen. When fed as a mixture into a DMFC, they react to generate one molecule of CO2, 6 protons (H+), and 6 electrons to generate a flow of electric current. The protons and electrons generated by methanol and water react with oxygen to generate water. The methanol-water mixture provides an easy means of storing and transporting hydrogen, and is much better than storing liquid or gaseous hydrogen in storage tanks. Unlike hydrogen, methanol and water are liquids at room temperature and are easily stored in thin walled plastic containers. Therefore, DMFCs are lighter than their most closely related fuel cells, hydrogen-air fuel cells.

In terms of the amount of electricity generated, a DMFC can generate 300-500 milliwatts per centimeter squared. The area of the cell size and the number of cells stacked together will provide the necessary power generation for whatever the watt and kilowatt needs are for vehicular and stationary applications.

FIG. 1 and FIG. 2 illustrates a conventional DMFC 10, wherein FIG. 1 is a plan view of the conventional DMFC 10 and FIG. 2 is a cross-sectional view of the conventional DMFC 10 along line I-I of FIG. 1. As shown in FIG. 1 and FIG. 2, the conventional DMFC 10 comprises a bipolar platelet assembly 12 and a fuel container 14. The bipolar platelet assembly 12 comprises an upper frame 51, lower frame 52, cathode wire lath 121, a plurality of bended bipolar wire laths 122, 123, 124, 125, an anode wire lath 126, and membrane electrode assembly (MEA) 131, 132, 133, 134, 135 interposed between corresponding wire laths. The upper frame 51, the lower frame 52, the cathode wire lath 121, the plural bended bipolar wire laths 122, 123, 124, 125, the anode wire lath 126, and the MEA 131, 132, 133, 134, 135 are adhesively stacked together to produce the stack structure as shown in FIG. 2. Typically, epoxy resin 53 or the like is used in between adjacent MEA, thereby forming five basic cell units 21, 22, 23, 24 and 25. As known in the art, the cathode wire lath 121, bended bipolar wire laths 122, 123, 124, 125, and the anode wire lath 126 are titanium meshes treated by gold plating, and are therefore costly.

The basic cell unit 21 of the prior art DMFC 10 consists of the cathode wire lath 121, MEA 131, and the bended bipolar wire lath 122. The basic cell unit 22 consists of the bended bipolar wire lath 122, which functions as a cathode of the cell unit 22, MEA 132, and the bended bipolar wire lath 123, which functions as an anode of the cell unit 22. The basic cell unit 23 consists of the bended bipolar wire lath 123, which functions as a cathode of the cell unit 23, MEA 133, and the bended bipolar wire lath 124, which functions as an anode of the cell unit 23. The basic cell unit 24 consists of the bended bipolar wire lath 124, which functions as a cathode of the cell unit 24, MEA 134, and the bended bipolar wire lath 125, which functions as an anode of the cell unit 24. The basic cell unit 25 consists of the bended bipolar wire lath 125, which functions as a cathode of the cell unit 25, MEA 135, and the bended bipolar wire lath 126, which functions as an anode of the cell unit 25. Typically, each of the basic cell units 21, 22, 23, 24 and 25 provides a voltage of 0.6V, such that DMFC 10 comprising five serially connected basic cell units 21, 22, 23, 24 and 25 can provide a total voltage of 3.0V (0.6V×5=3.0V).

However, the above-described conventional DMFC 10 has several drawbacks. First, the bipolar platelet assembly 12 is too thick and thus unwieldy to carry. Furthermore, as mentioned, the cost of producing the conventional DMFC 10 is high since the cathode wire lath 121, bended bipolar wire laths 122, 123, 124, 125, and the anode wire lath 126 are titanium meshes treated by gold plating. Besides, the throughput of the conventional DMFC 10 is low because the bipolar wire laths 122, 123, 124, 125 are bended manually before mounting on the upper and lower frames. In light of the above, there is a need to provide a thin, inexpensive, and highly integrated DMFC that is capable of achieving the scale of mass production.

SUMMARY OF THE INVENTION

It is therefore an objective of the present invention to provide a novel flat direct methanol fuel cell (DMFC) for improving the above-mentioned problems.

Another objective of the present invention is to provide a method of fabricating a novel flat DMFC for increasing mass production.

Another objective of the present invention is to provide a novel DMFC with improved heat radiating ability.

According to the preferred embodiment of the present invention, an electrode plate of a flat panel direct methanol fuel cell (DMFC) comprises: a multilevel substrate that comprises a copper clad laminate (CCL), wherein the CCL comprises at least a radiating copper layer, and the radiating copper layer forms predetermined patterns via an etching process; a bonding sheet pressed on the radiating copper layer; and an electrode copper layer disposed on the bonding sheet, wherein the electrode copper layer is processed by an etching process for forming a predetermined electrode area and a drilling process for forming a plurality of through holes by penetrating the electrode copper layer, the bonding sheet, and the CCL.

According to another embodiment of the present invention, a method for fabricating a flat panel DMFC comprises: providing a multilevel substrate having copper clad laminate (CCL) thereon, a first copper layer disposed over the upper surface of the CCL, and a second copper layer disposed over the bottom surface of the CCL; performing a drilling process on a predetermined electrode area of the multilevel substrate for forming a plurality of through holes by penetrating the first copper layer, the CCL, and the second copper layer; depositing a chemical copper layer on the multilevel substrate and within the plurality of through holes; using a photoresistance for defining the predetermined electrode area on the multilevel substrate; using the photoresistance as an electroplating resist to perform an electroplating process for forming an electroplating copper layer in the area uncovered by the photoresistance, and forming a tin/lead layer thereon; removing the photoresistance; performing an etching process for removing the chemical copper layer not yet covered by the tin/lead layer, the first copper layer and the second copper layer; and etching the tin/lead layer for exposing the electroplating copper layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
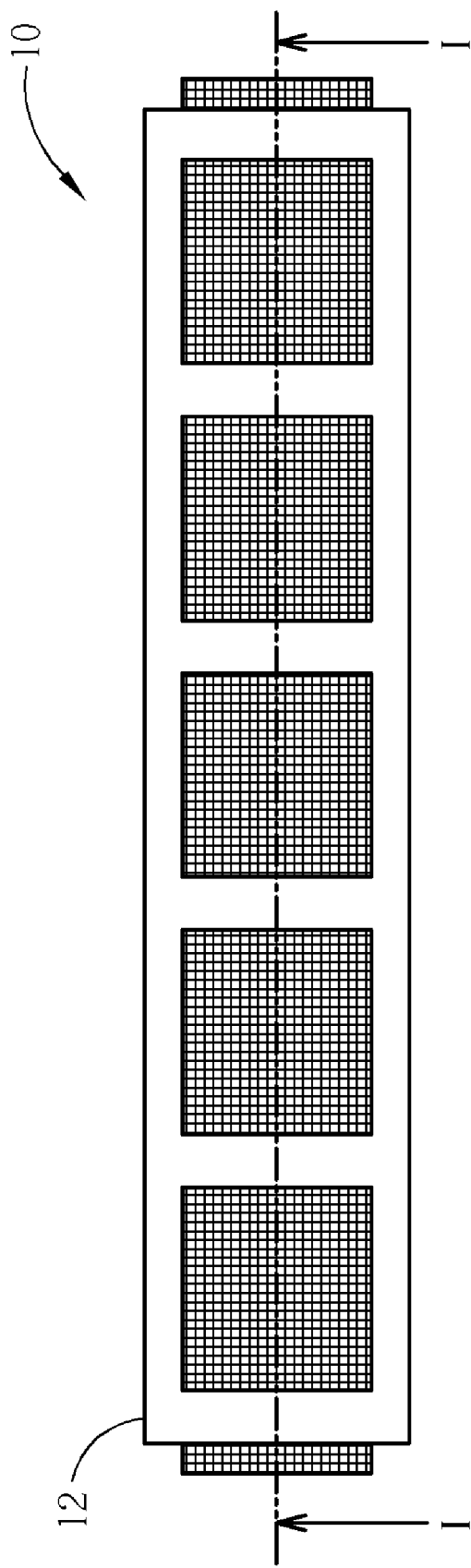
FIG. 1 is a plain view of the conventional Direct Methanol Fuel Cell.
Figure 2:
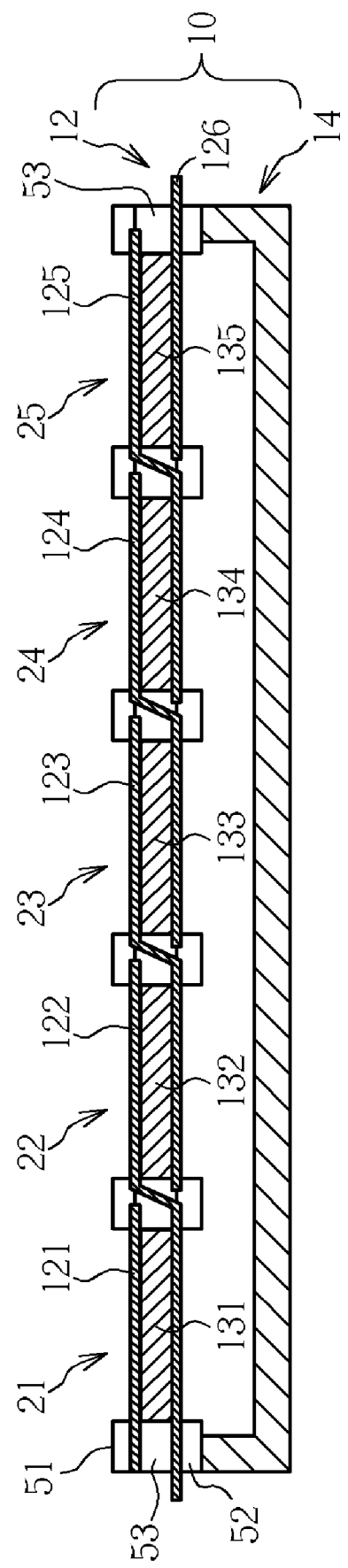
FIG. 2 is a cross-sectional view of the conventional Direct Methanol Fuel Cell along line I-I of FIG. 1.
Figure 3:
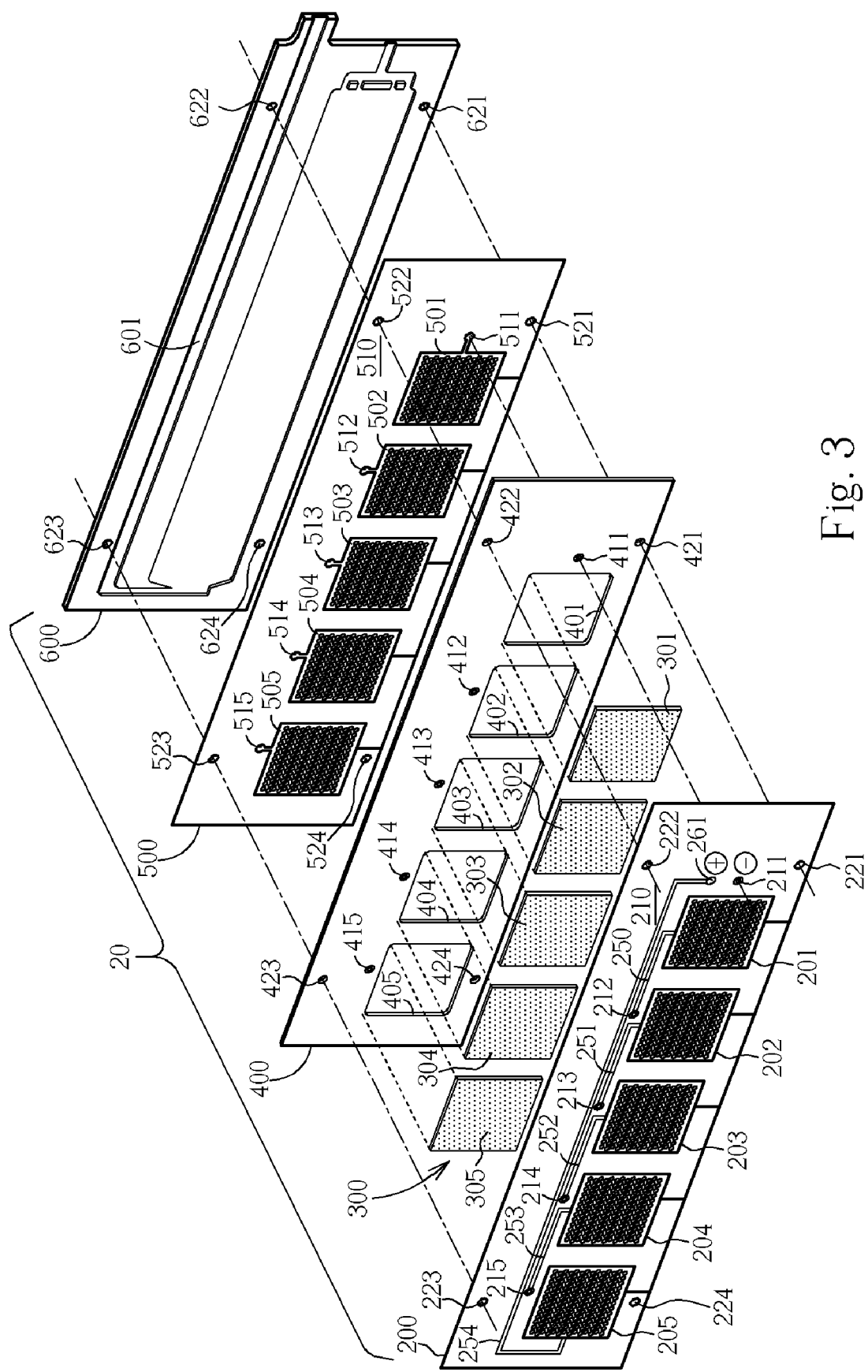
FIG. 3 is a perspective, exploded diagram illustrating a flat panel Direct Methanol Fuel Cell with five serially connected basic cell units in accordance with one preferred embodiment of the present invention.

Please refer to FIG. 3. FIG. 3 is a perspective, exploded diagram illustrating a flat panel DMFC 20 with five serially connected basic cell units in accordance with one preferred embodiment of the present invention. It is to be understood that the flat panel DMFC 20 with five serially connected basic cell units is merely an exemplary embodiment. Depending on the requirements of the applied apparatuses, other numbers of basic cell units such as ten or twenty may be used. As shown in FIG. 3, the present invention flat panel DMFC 20 generally comprises an integrated thin cathode electrode sheet 200, Membrane Electrode Assembly (MEA) unit 300, intermediate bonding layer 400, integrated thin anode electrode sheet 500, and a fuel container 600.

The integrated thin cathode electrode sheet 200 comprises a substrate 210, cathode electrode areas 201, 202, 203, 204, and 205, and conductive via through holes 211, 212, 213, 214, and 215. Preferably, on the surface area of the substrate 210 outside the cathode electrode areas 201, 202, 203, 204, and 205, and the conductive via through hole 211, 212, 213, 214, and 215, a layer of solder resist is coated thereon. At the corners of the substrate 210, mounting through holes 221, 222, 223, and 224 are provided. It is noteworthy that the integrated thin cathode electrode sheet 200 is fabricated by using PCB compatible processes. The substrate 210 may be made of ANSI-grade glass fiber reinforced polymeric materials such as FR-1, FR-2, FR-3, FR-4, FR-5, CEM-1 or CEM-3, but not limited thereto. Each of the cathode electrode areas 201, 202, 203, 204, and 205, on which a plurality of through holes are formed, is defined by a patterned copper foil. The opening ratio of each of the cathode electrode areas 201, 202, 203, 204, and 205, which is the ratio of the surface area of the through holes to the area of each of the cathode electrode areas, is preferably no less than 50%.

The conductive via through hole 212 is electrically connected to the cathode electrode area 201 with the conductive wire 250. The conductive via through hole 213 is electrically connected to the cathode electrode area 202 with the conductive wire 251. The conductive via through hole 214 is electrically connected to the cathode electrode area 203 with the conductive wire 252. The conductive via through hole 215 is electrically connected to the cathode electrode area 204 with the conductive wire 253. The cathode electrode area 205 is electrically connected to a positive (cathode) electrode node 261, which, in operation, is further electrically connected with an external circuit. The conductive via through hole 211, which acts as a negative (anode) electrode node of the DMFC 20, is electrically connected with the external circuit in operation.

The MEA unit 300 comprises a first proton exchange membrane 301, a second proton exchange membrane 302, a third proton exchange membrane 303, a fourth proton exchange membrane 304, and a fifth proton exchange membrane 305, corresponding to the cathode electrode areas 201, 202, 203, 204, and 205. Each of the proton exchange membranes 301, 302, 303, 304, and 305 may use commercially available proton conducting polymer electrolyte membranes, for example, NAFION™, but not limited thereto.

The intermediate bonding layer 400 comprises at least one bonding sheet, which may be made of Prepreg B-stage resin, which is an ordinary material in PCB processes. The Prepreg B-stage resin may be completely cured at about 140° C. for a process time period of about 30 minutes. Corresponding to the proton exchange membranes 301, 302, 303, 304, and 305, five openings 401, 402, 403, 404, and 405 are provided on the intermediate bonding layer 400 for accommodating respective proton exchange membranes. At a side of the opening 401 corresponding to the conductive via through hole 211 of the substrate 210, as specifically indicated in FIG. 3, a conductive via through hole 411 is provided. At a side of respective openings 402, 403, 404, and 405 corresponding to the conductive via through holes 212, 213, 214, and 215, conductive via through holes 412, 413, 414, and 415 are provided. In another case, the intermediate bonding layer 400 may further include a thin supporting layer that is made of glass fiber reinforced polymeric materials such as FR-1, FR-2, FR-3, FR-4, FR-5, CEM-1 or CEM-3. At the corners, corresponding to the mounting through holes 221, 222, 223, and 224 of the substrate 210, there are mounting through holes 421, 422, 423, and 424 provided.

The integrated thin anode electrode sheet 500 comprises a substrate 510, anode electrode areas 501, 502, 503, 504, and 505, and conductive pads 511, 512, 513, 514, and 515. It is noteworthy that the anode electrode areas 501, 502, 503, 504, 505 are defined simultaneously with the conductive pads 511, 512, 513, 514, 515. At the corners of the substrate 510, corresponding to the mounting through holes 221, 222, 223, and 224 of the substrate 210, there are mounting through holes 521, 522, 523, and 524 provided. The integrated thin anode electrode sheet 500 is fabricated by using PCB compatible processes. Likewise, the substrate 510 may be made of ANSI-grade glass fiber reinforced polymeric materials such as FR-1, FR-2, FR-3, FR-4, FR-5, CEM-1, CEM-3 or the like. Each of the anode electrode areas 501, 502, 503, 504, and 505, on which a plurality of through holes are formed, is defined by a patterned copper foil. The opening ratio of each of the anode electrode areas is preferably no less than 50%.

The fuel container 600 has fuel channel 601 and mounting through holes 621, 622, 623, and 624 corresponding to the mounting through holes 221, 222, 223, and 224 of the substrate 210. The fuel container 600 may be made of polymeric materials such as epoxy resin, polyimide, or acrylic. The fuel channel 601 may be fabricated by using conventional mechanical grinding methods or plastic extrusion methods.

When assembling, the proton exchange membranes 301, 302, 303, 304, and 305 are installed within the respective openings 401, 402, 403, 404, and 405 of the intermediate bonding layer 400. The intermediate bonding layer 400, together with the installed proton exchange membranes 301, 302, 303, 304, and 305, is then sandwiched by the integrated thin cathode electrode sheet 200 and the integrated thin anode electrode sheet 500. The resultant laminate stack having (in order) the integrated thin cathode electrode sheet 200, Membrane Electrode Assembly (MEA) unit 300, the intermediate bonding layer 400 (and installed proton exchange membranes), and the integrated thin anode electrode sheet 500 is then mounted on the fuel container 600.

The conductive via through holes 211, 212, 213, 214 and 215 of the integrated thin cathode electrode sheet 200 are aligned, and in contact, with the respective conductive via through holes 411, 412, 413, 414 and 415 of the intermediate bonding layer 400, which are aligned with the conductive pads 511, 512, 513, 514 and 515 of the integrated thin anode electrode sheet 500. Conventional soldering process may be used to electrically connect and fix the aligned conductive through holes such as conductive via through holes 211, 411, and conductive pad 511, and so on. By doing this, the cathode electrode area 201 of the integrated thin cathode electrode sheet 200 is electrically connected to the anode electrode area 502 of the integrated thin anode electrode sheet 500 through the conductive path constituted by the conductive wire 250, the soldered conductive via through holes 212 and 412, and the conductive pad 512 of the integrated thin anode electrode sheet 500. The cathode electrode area 202 of the integrated thin cathode electrode sheet 200 is electrically connected to the anode electrode area 503 of the integrated thin anode electrode sheet 500 through the conductive path constituted by the conductive wire 251, the soldered conductive via through holes 213 and 413, and the conductive pad 513 of the integrated thin anode electrode sheet 500, and so on. The conductive via through hole 211 of the integrated thin cathode electrode sheet 200, which acts as the negative electrode of the DMFC 20, is electrically connected to the anode electrode area 501 and conductive pad 511 of the integrated thin anode electrode sheet 500 through the conductive via through hole 411 of the intermediate bonding layer 400.

It is advantageous to use the present invention because the DMFC 20 has integrated thin cathode electrode sheet 200 and integrated thin anode electrode sheet 500, which reduce the thickness as well as the production cost of the DMFC 20. No bended bipolar wire lath is needed. The integrated thin cathode electrode sheet 200 and integrated thin anode electrode sheet 500 are fabricated by using PCB compatible processes, thus can achieve the scale of mass production. Another benefit is that the control circuit layout for controlling the DMFC and external circuit can be integrated on the substrate 210 or 510.

Nevertheless, heat is commonly produced when the fuel cell is generating electricity. According to the preferred embodiment of the present invention, when the overall temperature of the fuel cell is above 70° C., the efficiency of the MEA unit 300 will decrease and the amount of electricity generated by the fuel cell will be affected. A method for fabricating the integrated thin cathode electrode sheet 200 and the integrated thin anode electrode sheet 500 of the DMFC 20 is now described in detail with reference to FIG. 4 to FIG. 12. According to this invention, the method for fabricating the integrated thin cathode electrode sheet 200 and the integrated thin anode electrode sheet 500 of the DMFC 20 is compatible with standard PCB processes.

Figure 4:
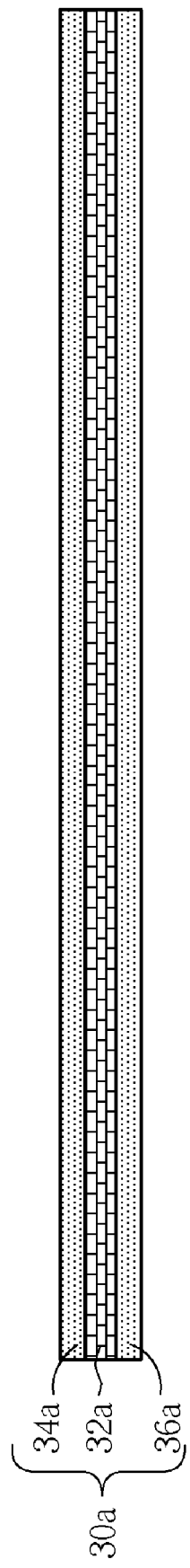
FIG. 4 to FIG. 14 illustrate a method for fabricating an integrated thin cathode electrode sheet and an integrated thin anode electrode sheet of the DMFC according to this invention.

First, as shown in FIG. 4, a CCL (Copper Clad Laminate) substrate 30a is provided. The CCL substrate 30a is commercially available and has a thickness of few millimeters. The CCL substrate 30a comprises a base layer 32a, a copper layer 34a laminated to an upper surface of the base layer 32a, and a copper layer 36a laminated to a lower surface of the base layer 32a.

Figure 5:
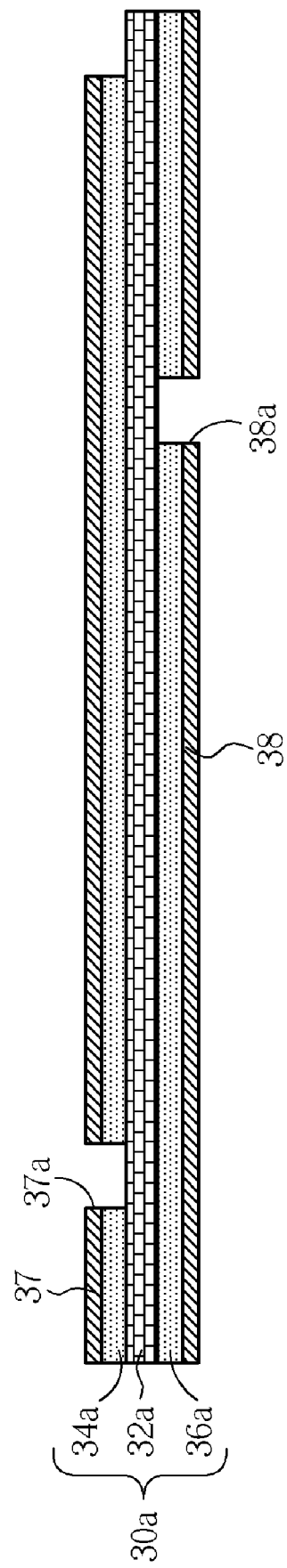

As shown in FIG. 5, a photolithography and an etching process are performed on the copper layers 34a and 36a. First, photoresistance 37 and 38 with patterns are formed on the copper layers 34a and 36a, in which the photoresistance 37 and 38 also include openings 37a and 38a for exposing the copper layers 34a and 36a. Next, a wet etching process is performed by using the photoresistance 37 and 38 as an etch-stopping mask to etch the exposed copper layers 34a and 36a through the openings 37a and 38a for forming the required patterns within the copper layers 34a and 36a. The photoresistance 37 and 38 is removed thereafter.

According to the preferred embodiment of the present invention, the patterns formed within the copper layers 34a and 36a can be dummy area patterns used for radiating heat, and the copper layers 34a and 36a can be any layer within a multi-layer substrate except for the surface layer. In order to radiate heat, the copper layers should be situated in proximity to the surface of the substrate and the thickness of the copper layer 34a or 36a should be at least 17 µm. The thickness of the copper layers 34a or 36a according to the preferred embodiment is approximately 35 µm. Moreover, the patterns formed within the copper layer 34a and 36a can also be utilized as an embedded active circuit for integrating with the energy management system (EMS) that controls the DMFC 20. Preferably, the layout of the circuit can be adjusted according to the functional demands of the fuel cell.

Figure 6:
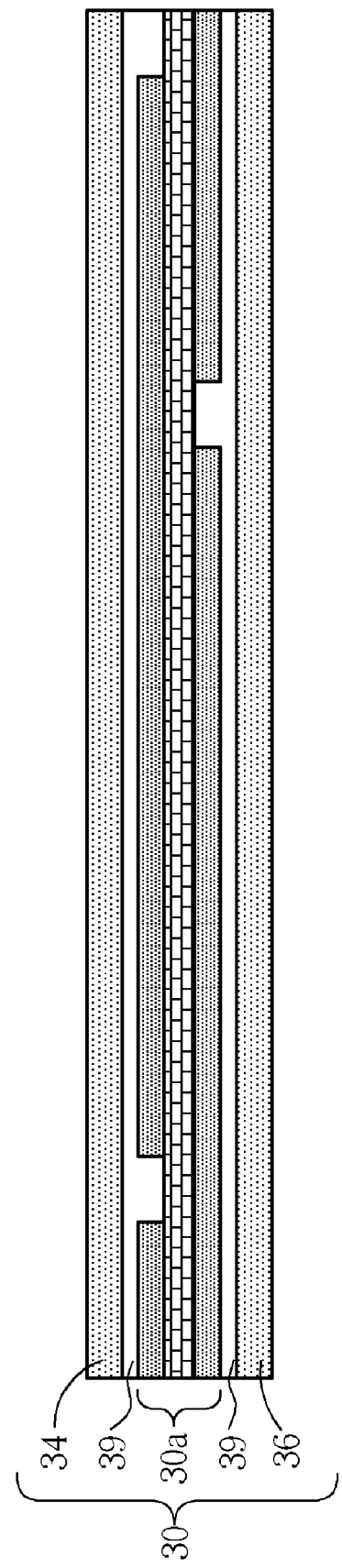

As shown in FIG. 6, a multi-layer substrate 30 is formed by laminating the CCL 30a in between bonding sheets 39 and metal plates 34 and 36, in which the metal plates 34 and 36 can be comprised of copper clad, and the bonding sheets 39 can be made of B-stage prepreg resin. Alternatively, the multi-layer substrate 30 can be utilized to combine with a plurality of bonding sheets 39 and metal plates 34 or 36 to form a multi-layer circuit board.

Before the lamination process is performed, a surface blackening process is performed on the copper layers 34a and 36a of the CCL 30a to increase the roughness of the surface. Preferably, the surface blackening process is performed by utilizing a strong oxidizing agent, such as solutions containing sulfuric acid.

Figure 7:
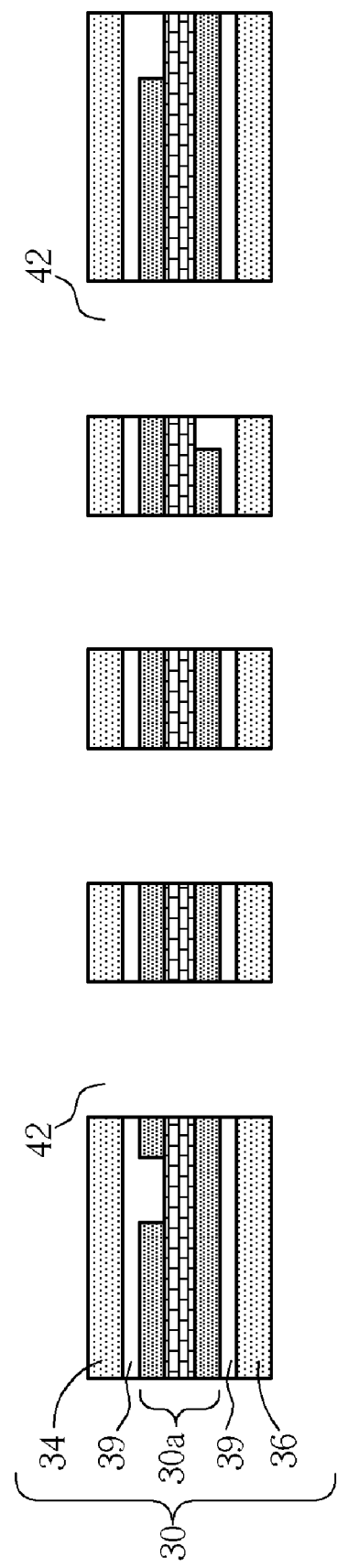

As shown in FIG. 7, a drilling process is performed on the predetermined area of the substrate 30 to penetrate the copper layer 34, the bonding sheet 39, the substrate 30a, and the copper layer 36 to form a plurality of through holes 42.

Figure 8:
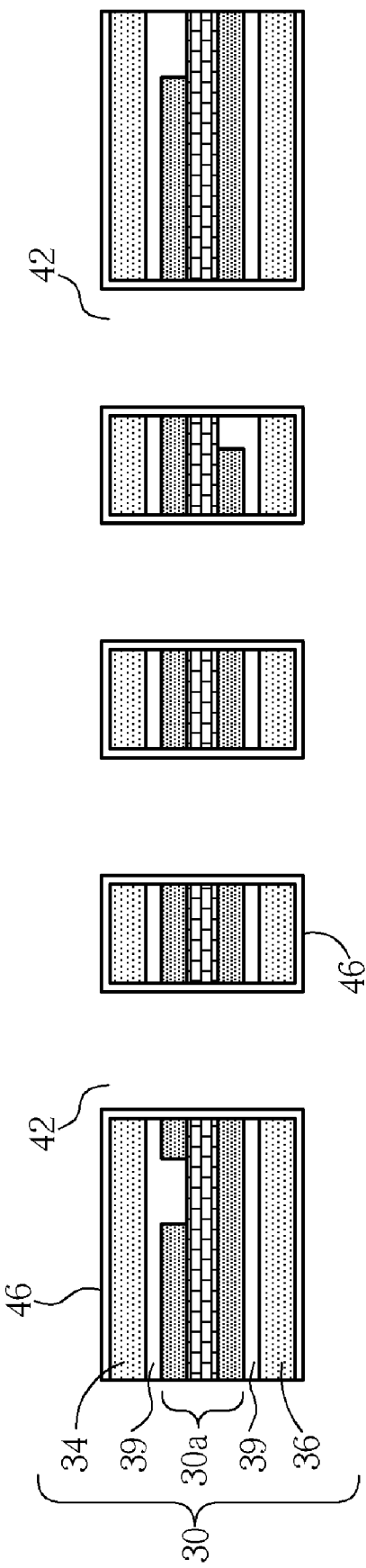

Next, a chemical copper layer 46 is formed on the substrate 30 and within the through holes 42, as shown in FIG. 8. By forming the chemical copper layer 46 via a chemical deposition method, the chemical copper layer 46 is deposited evenly on the substrate 30 and within the through holes 42.

Figure 9:
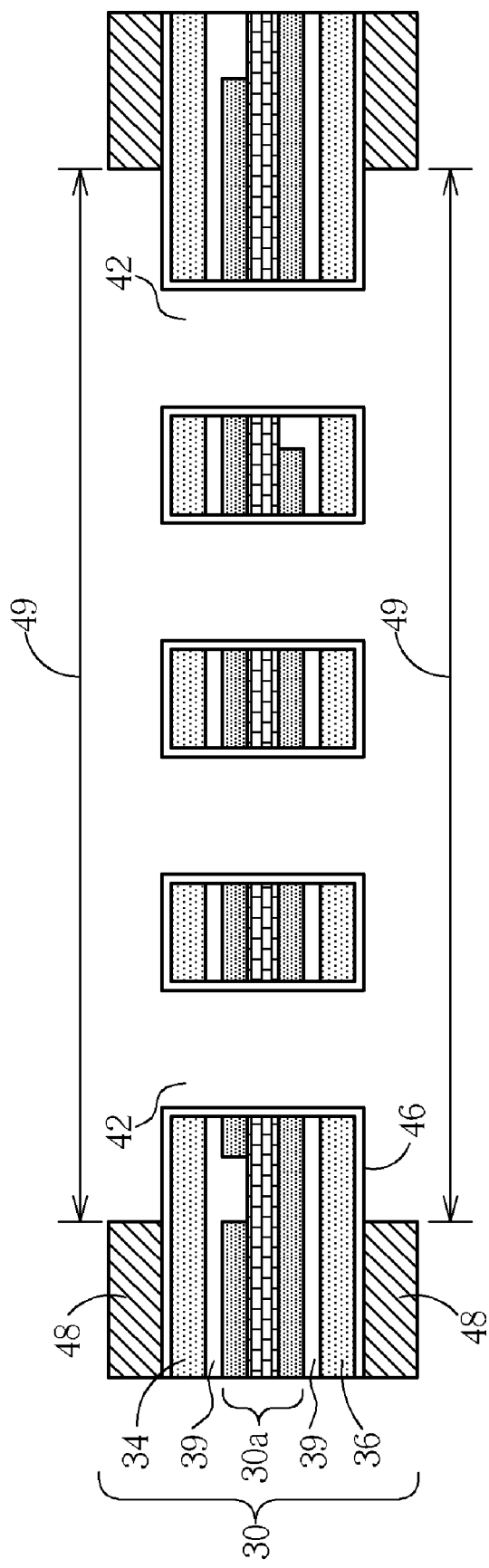

As shown in FIG. 9, a predetermined electrode area 49 is defined on the substrate 30 by using a photoresistance 48. Relating to the integrated thin cathode electrode sheet 200 of FIG. 3, the predetermined electrode area 49 corresponds to the cathode electrode areas 201-205, and the photoresistance 48 also defines the conductive wires 250-254 and the positive electrode node 261 (not shown). Preferably, the fabrication of the integrated thin cathode electrode sheet 200 and the conductive via through holes 211-215 are completed at the same time as the through holes 42 within the predetermined electrode area 49. Relating to the integrated thin anode electrode sheet 500 of FIG. 3, the predetermined electrode area 49 corresponds to the anode electrode areas 501-505, and the photoresistance 48 further defines the conductive pads 511-515 and the connecting area (not shown) between the conductive pads and the anode electrode areas.

Figure 10:
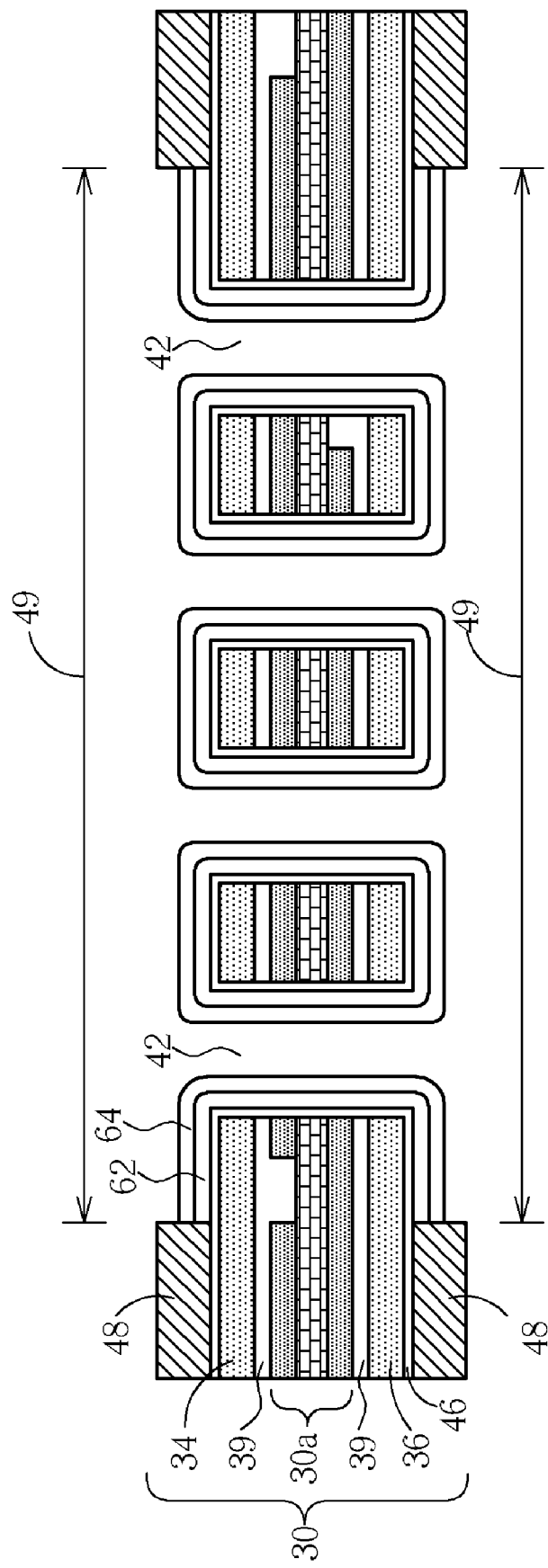

Next, an electroplating process is performed by using the photoresistance 48 as an electroplating barrier to form a copper layer 62 on the area uncovered by the photoresistance 48, including the predetermined electrode area 49, and a tin/lead layer 64 on the copper layer 62, as shown in FIG. 10.

Figure 11:
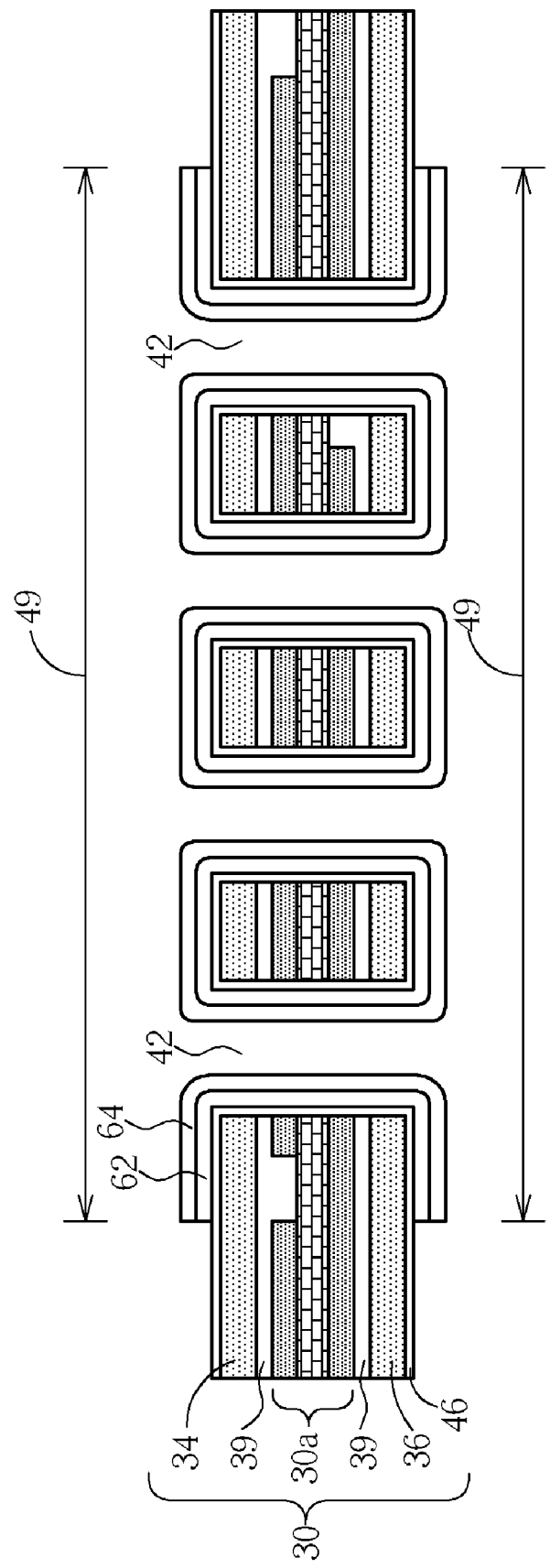

As shown in FIG. 11, the photoresistance 48 is removed thereafter.

Figure 12:
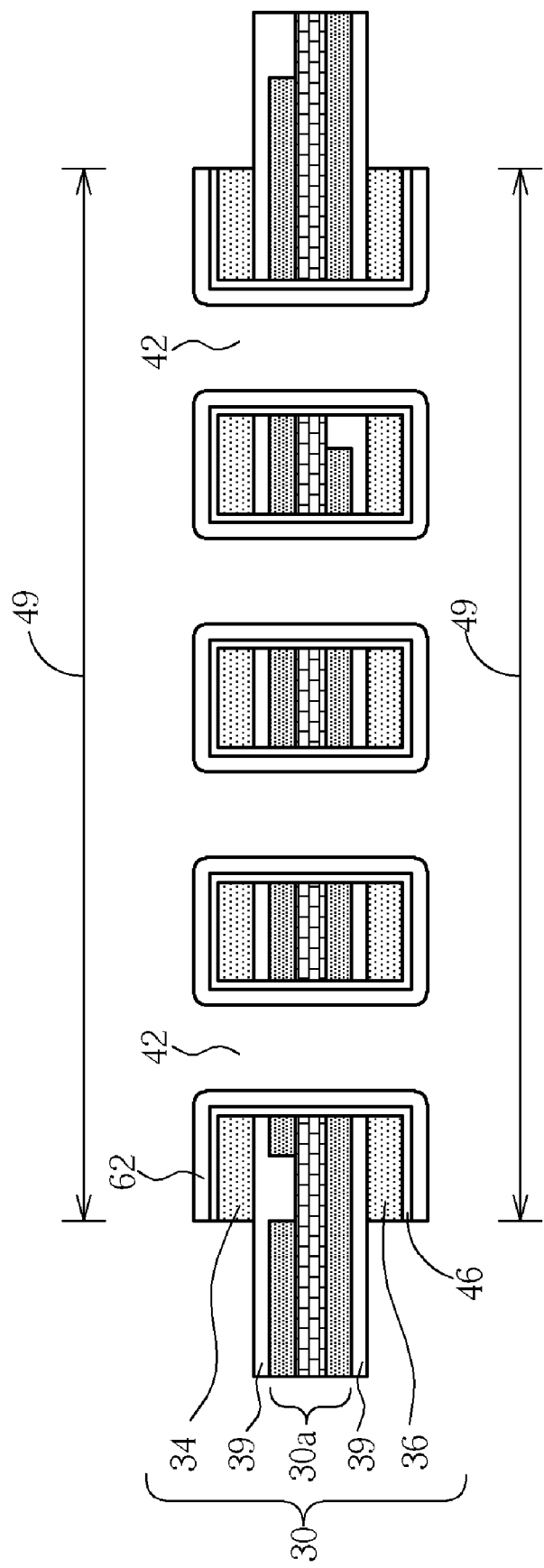

A copper etching process is then performed to remove the chemical copper layer 46 not yet covered by the tin/lead layer 64 and the copper layers 34 and 36 on the substrate 30, as shown in FIG. 12. Next, another etching process is performed to remove the tin/lead layer 64 to expose the copper layer 62 and complete the initial fabrication of the integrated thin anode electrode sheet 500.

Figure 13:
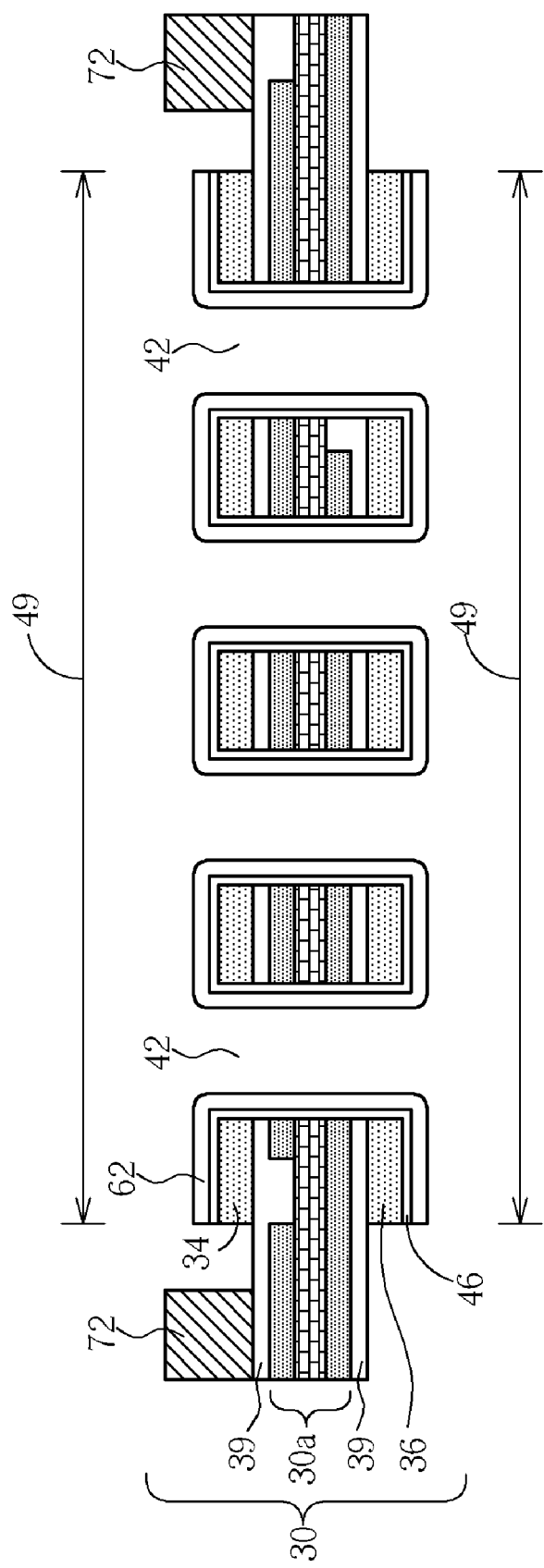

In order to prevent any damage to the substrate during the soldering process, a solder resist 72 is applied, as shown in FIG. 13. Used widely in circuit board industries, the solder resist is comprised of photosensitive materials, in which the solder resist can also be used to define the required protective area on the integrated thin cathode electrode sheet 200 by a standard photolithography process.

Figure 14:
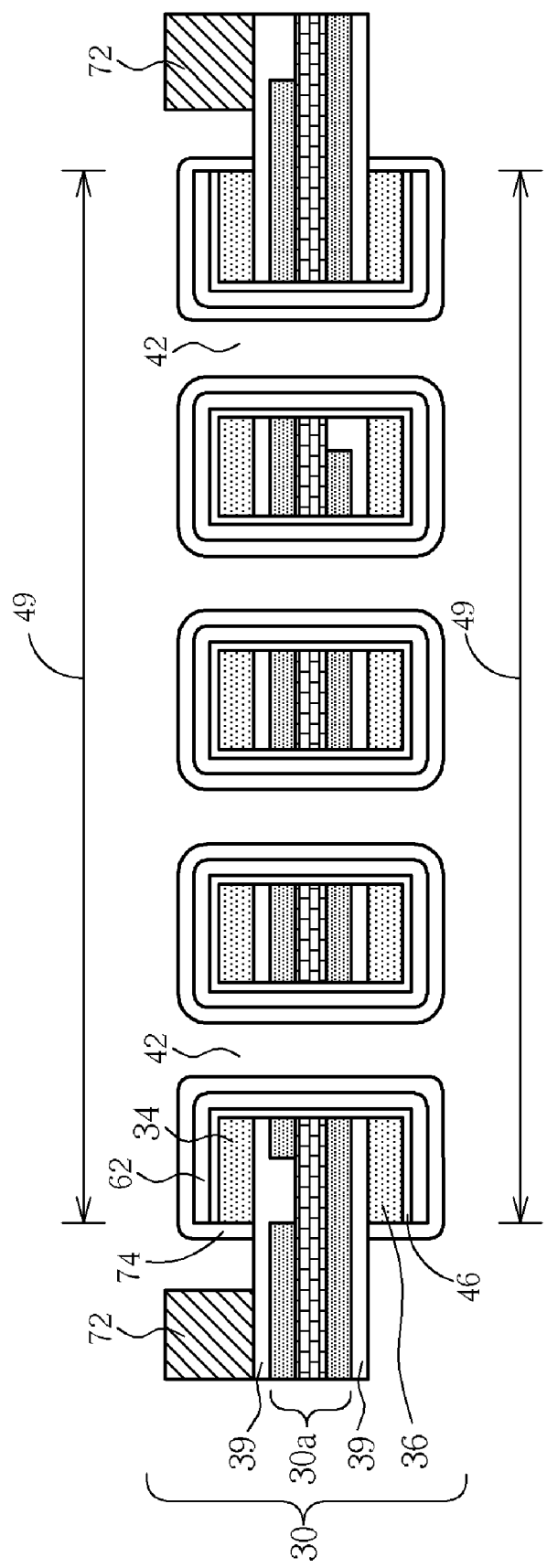

Next, an electroplating process is performed to form a protective layer 74 over the surface of the electrodes to prevent the oxidation of the integrated thin cathode electrode sheet 200 after long exposure in the air, as shown in FIG. 14. Preferably, the protective layer 74 is comprised of nickel/gold, tin/lead, graphite carbon, or chemical silver.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrode plate of a flat panel direct methanol fuel cell (DMFC) comprising:
    a multilevel substrate that comprises a copper clad laminate (CCL), wherein the CCL comprises a base layer, at least a heat-radiating copper layer on the base layer;
    a bonding sheet on the heat-radiating copper layer, wherein the bonding sheet and the base layer insulate the heat-radiating copper layer;
    an electrode copper layer on the bonding sheet; and
    a plurality of through holes within an electrode area, wherein the through holes penetrate the electrode copper layer, the bonding sheet, the heat-radiating copper layer and the base layer, wherein a solder resist is coated in the area outside the predetermined electrode area, and a protective layer is formed within the predetermined electrode area, and wherein the protective layer is a graphite carbon layer.

2. The electrode plate of the flat panel DMFC of claim 1, wherein the protective layer is a nickel/gold layer.

3. The electrode plate of the flat panel DMFC of claim 1, wherein the protective layer is a tin/lead layer.

4. The electrode plate of the flat panel DMFC of claim 1, wherein the protective layer is a chemical silver layer.

5. The electrode plate of the flat panel DMFC of claim 1, wherein the radiating copper layer is treated with a surface blackening process.

6. The electrode plate of the flat panel DMFC of claim 5, wherein the surface blackening process is performed by exposing the protective layer to an oxidizing agent.

7. The electrode plate of the flat panel DMFC of claim 6, wherein the oxidizing agent is sulfuric acid.

8. The electrode plate of the flat panel DMFC of claim 1, wherein the thickness of the radiating layer is at least 17 μm.

9. The electrode plate of the flat panel DMFC of claim 1, wherein a chemical copper layer is formed on interior surfaces of the through holes and on the electrode copper layer.

10. The electrode plate of the flat panel DMFC of claim 9, wherein an electroplated copper layer is formed on the chemical copper layer.

11. The electrode plate of the flat panel DMFC of claim 1, wherein the heat-radiating copper layer is utilized as an embedded active circuit for integrating with an energy management system (EMS) that controls the DMFC.

* * * * *